United States Patent [19]

Nishibe

[11] Patent Number: 4,670,877

[45] Date of Patent: Jun. 2, 1987

[54] LSI CIRCUIT WITH SELF-CHECKING FACILITATING CIRCUIT BUILT THEREIN

[75] Inventor: Shinji Nishibe, Tokyo, Japan

[73] Assignee: Kabushiki Kaisha Toshiba, Kawasaki, Japan

[21] Appl. No.: 653,042

[22] Filed: Sep. 21, 1984

[30] Foreign Application Priority Data

Sep. 26, 1983 [JP] Japan .................................. 58-17739

[51] Int. Cl.[4] ............................................ G01R 31/28
[52] U.S. Cl. .................................... 371/15; 324/73 R; 371/27
[58] Field of Search ............................ 371/25, 15, 27; 324/73 R, 73 AT

[56] References Cited

U.S. PATENT DOCUMENTS

| | | | |
|---|---|---|---|
| 3,924,181 | 12/1975 | Alderson | 324/73 R |
| 4,513,418 | 4/1985 | Bardell, Jr. et al. | 371/25 |
| 4,519,078 | 5/1985 | Komonytsky | 371/25 |
| 4,551,838 | 11/1985 | Gannett | 371/25 |

OTHER PUBLICATIONS

Konemann et al., Built-in Test for Complex Digital Integrated Circuits, IEEE Journal of Solid-State Circuits, vol. SC-15, No. 3, Jun. 1980, pp. 315-319.
Le Blanc, LOCST: A Built-in Self-Test Technique, IEEE Design & Test, Nov. 1954, pp. 45-52.

*Primary Examiner*—Charles E. Atkinson
*Attorney, Agent, or Firm*—Cushman, Darby & Cushman

[57] ABSTRACT

According to this invention, an LSI circuit is provided with a pseudorandom data generating circuit for producing pseudorandom data and a timing signal generating circuit for producing test timing signals in synchronism with a control input timing signal necessary for the operation of an internal logic circuit. The LSI circuit has two input lines, a control input line and a data input line. The LSI circuit further includes a circuit, which selectively supplies the timing signals from the timing signal generating circuit on the control input line and selectively supplies the pseudorandom data from the psuedorandom data generating circuit on the data input line. Consequently, the LSI circuit automatically generates control input signals and data input signals within itself to carry out the self-checking operation.

3 Claims, 12 Drawing Figures

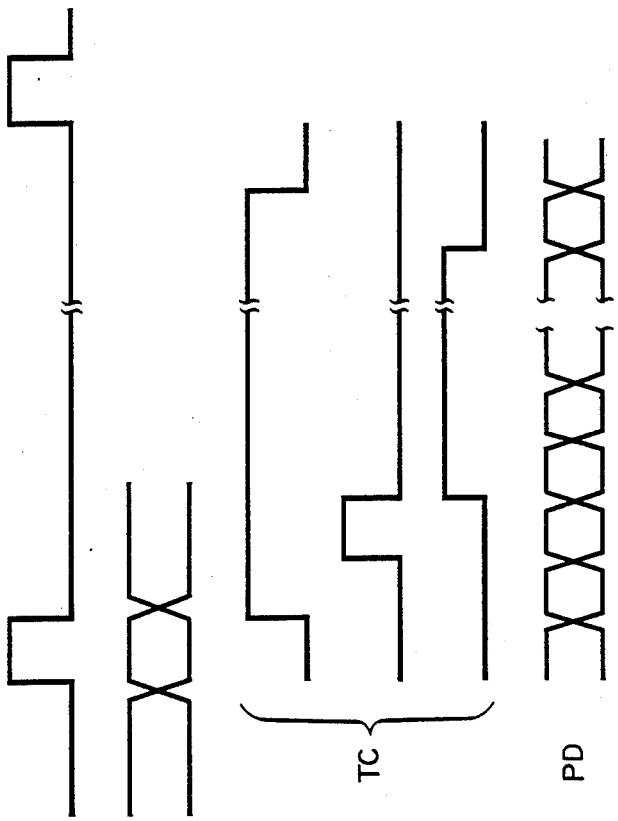

LSI CIRCUIT WITH SELF-CHECKING FACILITATING CIRCUIT BUILT THEREIN

BACKGROUND OF THE INVENTION

This invention relates to an LSI circuit with a built-in circuit to facilitate the self-checking function of the LSI circuit.

Recent achievements in the LSI field have been remarkable and are moving toward ever-increasing integration and complication. Especially, a custom-made LSI circuit, in particular, a gate array, which system designers can easily develop, has recently been in the spotlight and is going in a practical phase.

The gate array normally needs numerous test data to check the functions of its internal circuits, which results in lengthy testing. Various testing measures have therefore been developed for the problem.

FIG. 1 illustrates an LSI circuit with no function for producing testing data. Such an LSI circuit requires test data for every test conducted; the test data for checking the function of the internal circuits of the LSI circuit mounts up to a considerably large quantity. It is also actually impossible to prepare test data to cope with every foreseeable case.

FIG. 2 illustrates a system which comprises a psuedorandom data generator (PID-GEN) 3, using a linear feedback register and an output data compressor 4. When testing circuit functions, the system permits a switching circuit 5 to selectively switch the data flow from an ordinary input line to that from the psuedorandom data generator 3, supplies the selected data to an internal logic circuit 11, and then checks a signal output SO from the output data compressor 4. The prior art system automatically generates input data with a speed intrinsic to an LSI circuit, so that it achieves the test even with a large quantity of data at a higher speed. According to the prior art, however, because the data supplied from the psuedorandom data generator 3 always includes data that is not required to operate the LSI circuit, unnecessary tests are inevitably performed.

When many flip-flops are used in the internal circuits of an LSI circuit, the prior art system is also not effective in testing the circuit functions because even in execution of ordinary operations of the LSI circuit, desired logic operations cannot be carried out without entry of a specific stream of data.

FIG. 3 shows a means known to solve the problem. This means combines the system shown in FIG. 1 and the so-called scan system, which is representative of the IBM LSS (Level Sensitive Scan). The scan system has its internal flip-flops coupled to constitute a shift register and further has a SCANIN pin and a SCANOUT pin. After specific data is loaded in the flip-flop-based shift register through the path, which starts from the SCANIN pin and ends at the SCANOUT pin, the scan system reads out the output of the shift register from the SCANOUT pin for a functional check on an LSI circuit. The system illustrated in FIG. 3 allows the scan system to input specific data to a control flip-flop 7 in an internal logic circuit 6, executes logic operations using the output of a psuedorandom data generator (PID-GEN) 8, and then observes, as does the system of FIG. 2, a signal output SO from an output data compressor 9.

FIG. 4 exemplifies the configuration of the psuedorandom data generator 8; FIG. 5, the structure of the output data compressor 9. Both of these devices are constituted by flip-flops and exclusive gates.

Because the system of FIG. 3 is designed for nothing more than the detection of a functional failure in a circuit, however, it cannot be guaranteed that the combination of intended functions is properly running. The most desired operation would be to carry out the detection while performing the functions of an LSI circuit as specified. This operation is especially important for checking designed circuits.

SUMMARY OF THE INVENTION

With the above in mind, a principal object of the present invention is to provide an LSI circuit with a built-in self-checking circuit, such as a gate array, which is capable of efficiently checking internal circuits of the LSI circuit with high reliability.

The self-checking circuit according to this invention includes a timing signal generator for producing a test timing signal in synchronism with a control input timing signal used to operate an internal logic cirucit. A pseudorandom data generator is provided for producing random data. A switching arrangement is connected to both the timing signal generator and the pseudorandom data generator in such a manner to to selectively supply to the internal logic cirucit either the output signal from said timing signal generator and the output signal from the pseudorandom data generator, or the control input signal and the data input signal.

The present invention ensures the detection of function-failing units in an LSI circuit by automatically generating many data patterns for proper functional checks on the LSI circuit and permits the effective use of conventional techniques, thus achieving a highly practical self-detecting function.

BRIEF DESCRIPTION OF THE DRAWINGS

Other objects and features of the present invention will be apparent from the following description taken in connection with the accompanying drawings in which:

FIGS. 7A through 7F are timing charts for explaining the operation of the embodiment. To be specific, FIG. 7A illustrates a command trigger signal COMT, FIG. 7B a data input signal DI, FIGS. 7C to 7E various types of timing signals from a timing signal generator, and FIG. 7F an output signal from a psuedorandom data generator.

DETAILED DESCRIPTION OF THE PREFERRED EMBODIMENT

Figure 1:
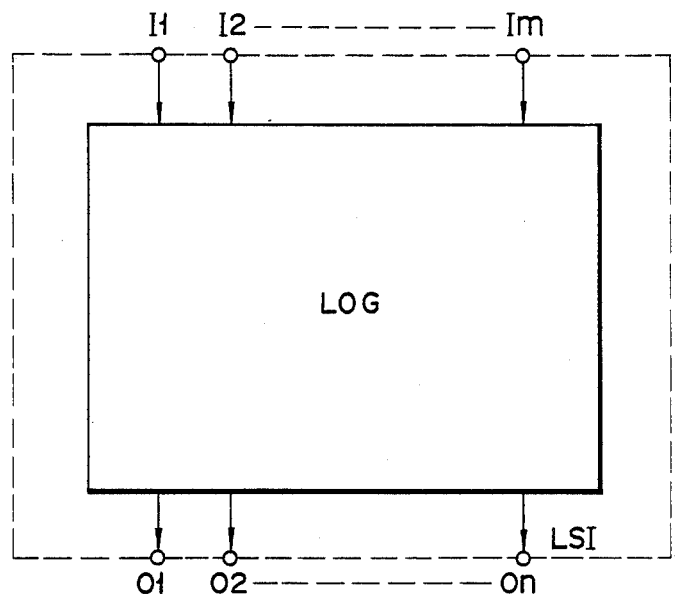
FIG. 1 is a diagram illustrating a conventional LSI circuit with no test data generating function.
Figure 2:
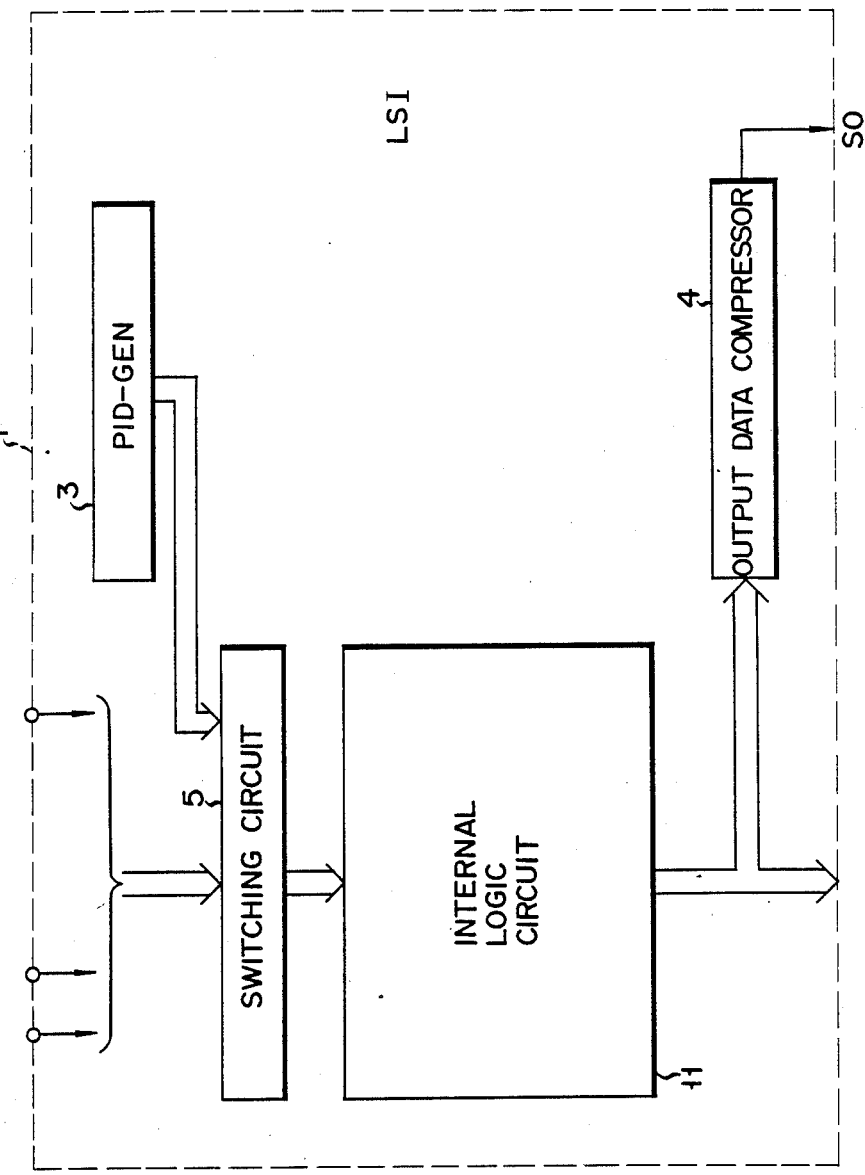
FIG. 2 is a block diagram illustrating a conventional system for testing the functions of an LSI circuit.
Figure 3:
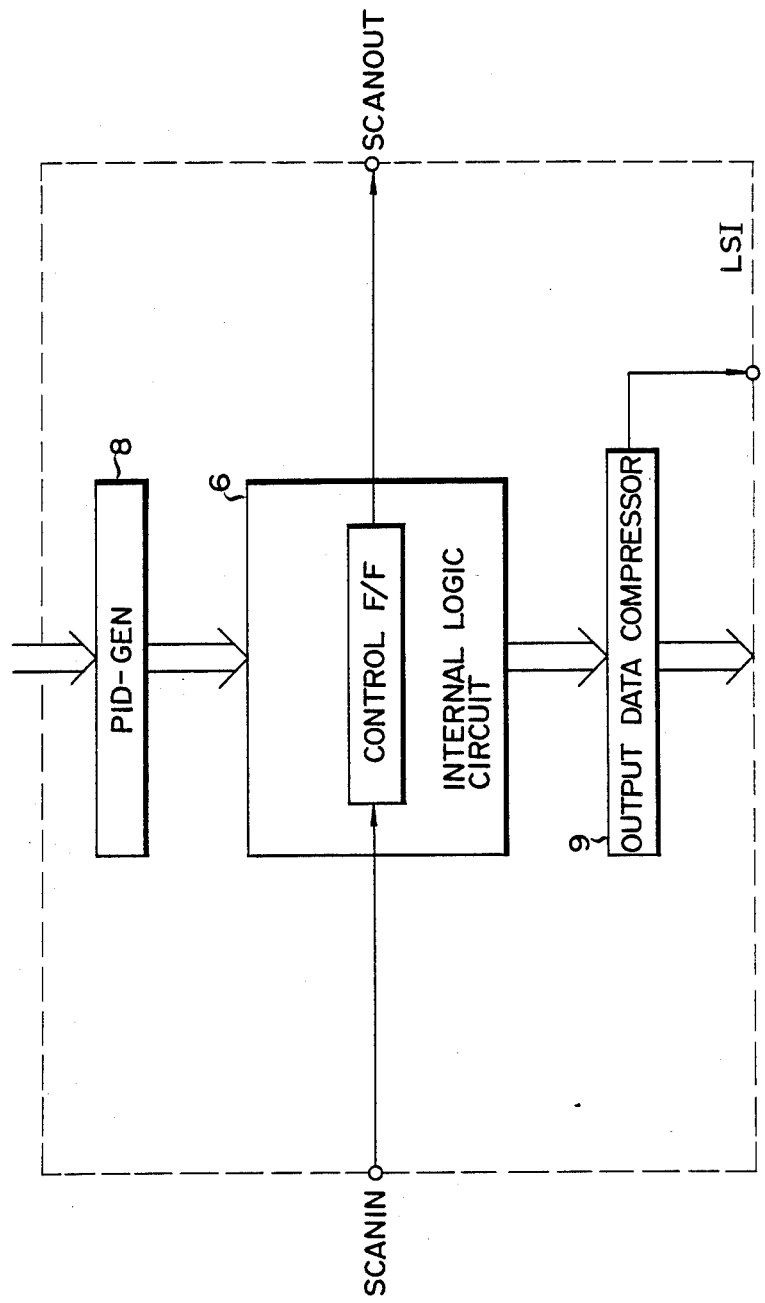
FIG. 3 is a block diagram showing another conventional system for testing the functions of an LSI circuit.
Figure 4:
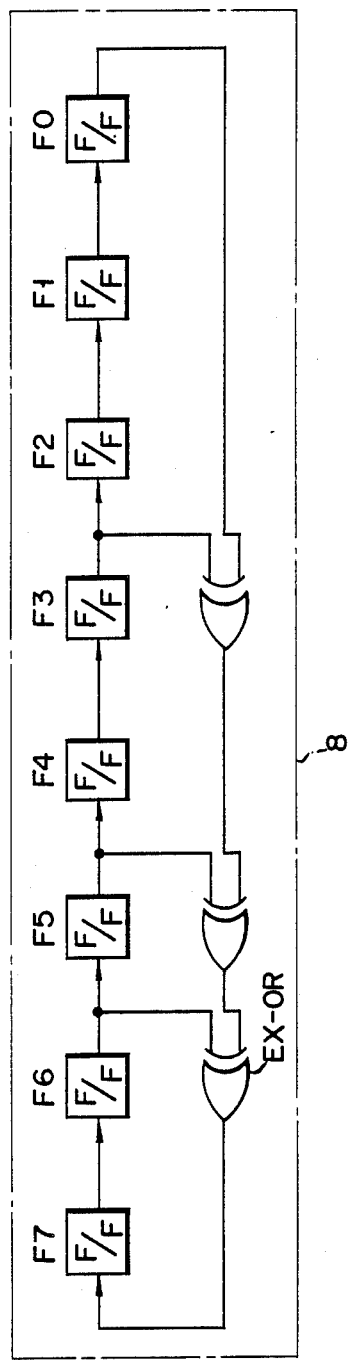
FIG. 4 is a circuit diagram showing a psuedorandom data generator used for the testing system of FIG. 2.
Figure 5:
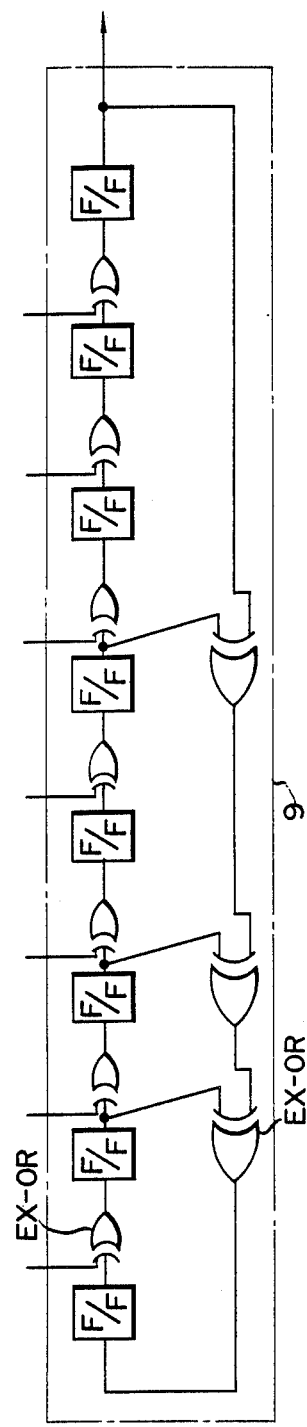
FIG. 5 is a circuit diagram showing an output data compressor used for the testing system of FIG. 2.
Figure 6:
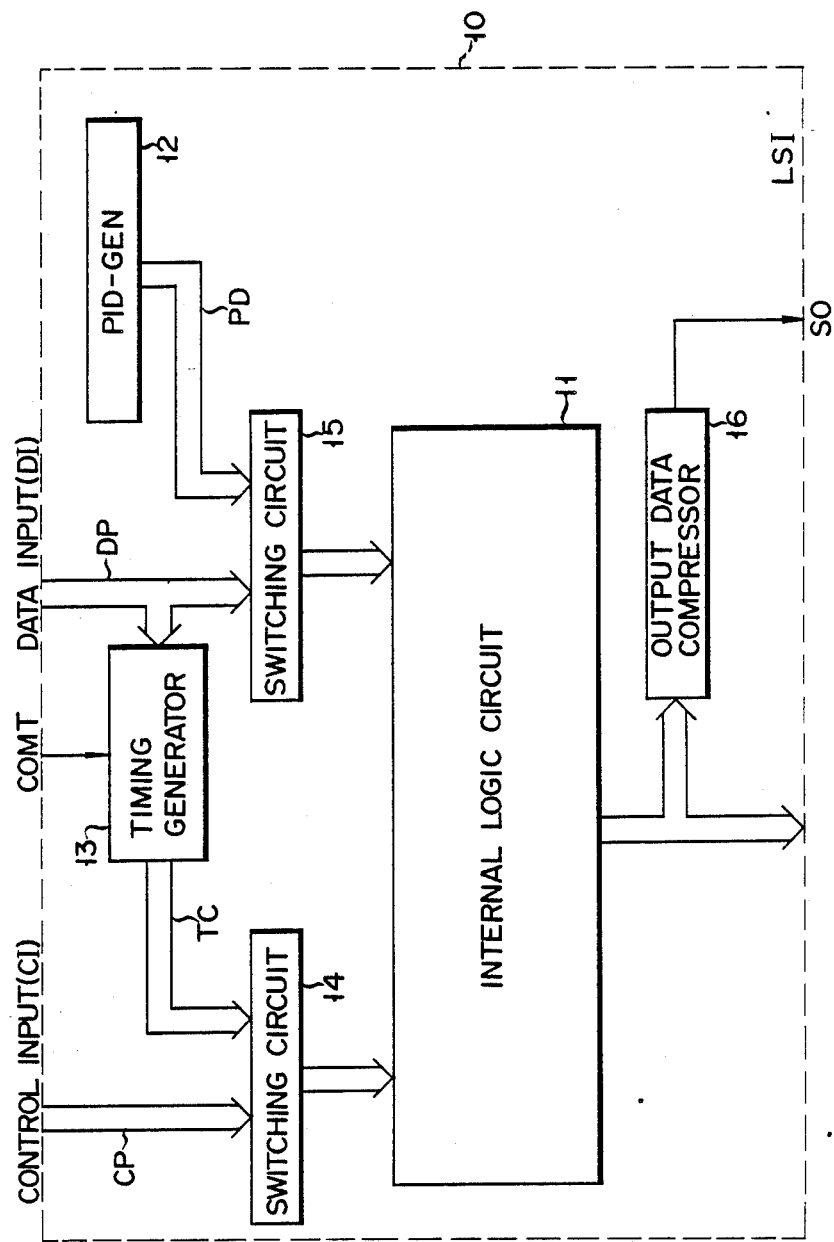
FIG. 6 is a block diagram illustrating an embodiment of this invenion.

FIG. 6 illustrates the circuit arrangement of an LSI circuit according to an embodiment of this invention. An LSI (Large Scale Integration) device 10 comprises an internal logic circuit 11, a psuedorandom data generator (PID-GEN) 12, a timing signal generator (TIM-GEN) 13, switching circuits 14 and 15 and an output data compressor 16. The LSI device 10 has two input lines, namely, a control input line CP and a data input line DP. Like in the system of FIG. 1, the data input line DP and an output data line PD of the psuedorandom data generator 12 can be switched from each other by the switching circuit 15 to be the input line of the internal logic circuit 11. The switching circuit 14 switches between the control input line CP and an output signal line TC of the timing signal generator 13, which produces a timing signal having the same signal sequence as an actual control input sequence.

The timing generator 13 starts operating upon receipt of a command trigger signal COMT (see FIG. 7A), supplied from an external unit. The timing signal generator 13 is further supplied with a data input signal DI (see FIG. 7B) through the data input line DP to properly select one of the timing signals TC shown in FIGS. 7C to 7E. As a result, psuedorandom data, as shown in FIG. 7F, produced from the psuedorandom data generator 12 allows for execution of the functions of the internal logic circuit 11, which are specified by the selected timing signal TC, and permits the detection of functional failure in the internal logic circuit 11 as well.

What is claimed is:

1. An LSI circuit having built-in self-checking comprising:
    an internal logic circuit;
    a data bus for supplying data to said internal logic circuit;
    a control bus for supplying a control signal to said internal logic circuit;
    pseudorandom data generator means for generating psuedorandom data to be supplied to said internal logic circuit via said data bus;
    timing signal generator means for supplying a test timing signal, having the same timing as a timing signal which would be used when said internal logic circuit is actually used, to said internal logic circuit via said control bus; and
    switching means, connected to both said timing signal generator means and said pseudorandom data generator means, for switching between the output signal from said timing signal generator means and an externally supplied control input signal, to selectively supply to said internal logic circuit either the output signal from said timing signal generator means and the output signal from said pseudorandom data generator means or the control input signal and the data input signal.

2. An LSI circuit according to claim 1, further comprising an output data compressor, coupled to the output side of said internal logic circuit, for observing the output of said internal logic circuit for vertification of said LSI cirucit.

3. An LSI circuit according to claim 1 further comprising means for supplying data to said timing signal generator means indicating the type of timing signal that said timing signal generator should output.

* * * * *

UNITED STATES PATENT AND TRADEMARK OFFICE
CERTIFICATE OF CORRECTION

PATENT NO. : 4,670,877
DATED : June 2, 1987
INVENTOR(S) : Shinji NISHIBE

It is certified that error appears in the above-identified patent and that said Letters Patent is hereby corrected as shown below:

ON THE TITLE PAGE:

At Box [30], change the Japanese application No. "58-17739" to --58-177395--.

Signed and Sealed this

Nineteenth Day of January, 1988

Attest:

DONALD J. QUIGG

Attesting Officer     Commissioner of Patents and Trademarks